United States Patent
Liaw

(12) 
(10) Patent No.: US 7,146,599 B2
(45) Date of Patent: Dec. 5, 2006

(54) METHOD FOR USING ASYMMETRIC OPC STRUCTURES ON LINE ENDS OF SEMICONDUCTOR PATTERN LAYERS

(75) Inventor: Jhon Jhy Liaw, hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 367 days.

(21) Appl. No.: 10/823,822

(22) Filed: Apr. 15, 2004

(65) Prior Publication Data

US 2005/0233223 A1  Oct. 20, 2005

(51) Int. Cl.
*G06F 17/50* (2006.01)
(52) U.S. Cl. .................... 716/19; 716/4; 716/21
(58) Field of Classification Search ............ None
See application file for complete search history.

(56) References Cited

U.S. PATENT DOCUMENTS

| | | | | |
|---|---|---|---|---|
| 6,189,136 B1* | 2/2001 | Bothra | ............... | 716/21 |
| 6,303,253 B1* | 10/2001 | Lu | ............... | 430/5 |
| 6,631,307 B1* | 10/2003 | Tzu et al. | ............... | 700/163 |
| 6,670,081 B1* | 12/2003 | Laidig et al. | ............... | 430/5 |
| 6,673,638 B1* | 1/2004 | Bendik et al. | ............... | 438/14 |
| 6,753,115 B1* | 6/2004 | Zhang et al. | ............... | 430/5 |
| 6,875,545 B1* | 4/2005 | Eurlings et al. | ............... | 430/5 |
| 2004/0107410 A1* | 6/2004 | Misaka et al. | ............... | 716/8 |
| 2005/0022150 A1* | 1/2005 | Liu et al. | ............... | 716/19 |

* cited by examiner

*Primary Examiner*—Leigh M. Garbowski
(74) *Attorney, Agent, or Firm*—Duane Morris LLP

(57) ABSTRACT

A method is disclosed for conducting optical proximity correction (OPC) on at least two features in a circuit design. After detecting a first feature having at least one end thereof to be in the proximity of one end of a second feature, a first OPC pattern is incorporated to the end of the first feature toward a first direction; and a second OPC pattern is incorporated to the end of the second feature toward a second direction that is substantially opposite from the first direction.

21 Claims, 2 Drawing Sheets

METHOD FOR USING ASYMMETRIC OPC STRUCTURES ON LINE ENDS OF SEMICONDUCTOR PATTERN LAYERS

BACKGROUND

The present disclosure relates generally to semiconductor device manufacturing, and more particularly to the methods for correction of line-width and line-space deviations in photolithography processes used to print and transfer circuit component and patterns onto a semiconductor device substrate.

The manufacture of semiconductor integrated circuits (ICs) and devices require the use of many photolithography process steps to define and create specific circuit components and circuit layouts onto an underlying substrate layer. Conventional photolithography systems project specific circuit and/or component images, defined by a mask pattern reticle, onto a flat substrate material layer coated with a light sensitive film (photoresist) coating. After image exposure, the film is then developed leaving the printed image of the circuit and/or component on the substrate layer. The imaged substrate is subsequently processed with techniques such as etching and doping to alter the substrate layer with the transferred pattern.

The photolithography manufacturing processes experience challenges when the critical dimensions and CDs (the minimum distances between edges of various types of features critical to the definition of IC performance) approach or drop below the wavelength of the light source used within the photolithography operations. At CDs near or below the light wavelength, typically in the sub-micron range, integrity of the printed image pattern may deviate due to several effects, including optical proximity distortions and chemical processing fluctuations. Manifestation of these effects typically includes line-end shortening, line-ends bridging, and/or line-width variations that may also have some dependency upon the substrate material layer and the local density of the pattern lines. Pattern imaging of certain material layers may be more sensitive to certain manifestations of the optical proximity effect. For example, metal layers are more sensitive to the line-shortening issue because metal contacts and interconnections are often located at line-ends, where line-end extensions of greater than 25 nm (nanometer) may be required to ensure proper and complete formation of the contact and interconnect structures. As devices continue to shrink to a smaller size, metal lines with layer thickness of less than 150 nm and/or metal line-to-metal line spacing of less than 100 nm may be highly sensitive to line-end bridging due to distortions and deviations. Similarly, gate layers of the IC substrate with layer thickness of less than 100 nm and/or gate line spacing of less than 110 nm may be highly sensitive to line-end distortions and deviations. Other active material layers of the device substrate may have other or similar dimensional sensitivities to the line-end distortions and deviations.

To avoid or lessen these and other optical proximity effects, the semiconductor industry has attempted to compensate for them with through the modification of the photolithography mask patterns. Such compensation results with improvements to IC production and device yields, significant manufacturing costs reductions (materials, equipment, manpower) as well as the enabling of the semiconductor fabrication facilities for more aggressive device and process technology generations.

A common compensation technique is generally referred to as optical proximity correction (OPC). Distortions/deviations that are targeted for correction by OPC may include line-end shortening, line-end bridging, line width variations, line corner rounding, line density and line depth of focus. The ultimate goal of OPC is to obtain the capability to produce smaller features within an IC design using given equipment set by enhancing the printability of a mask pattern. The OPC technique applies systematic changes to mask pattern geometries to compensate for the distortions caused by optical diffraction and scattering from the photolithography operations. A mask pattern incorporating OPC is thus a system that negates undesirable distortion effects during pattern transfer. OPC works by making small changes to the IC layout that anticipates the distortions/ deviations. Additional features are added to the original mask pattern such that the OPC features are typically sub-resolution (i.e. having dimensions less than the resolution of the light exposing tool) and thus do not transfer onto the device substrate. It is noted that these features interact with the original mask pattern as to improve the final transferred pattern. Such features are commonly known as "serifs". Serifs are the typically small, appendage-type addition or subtraction regions typically made at the corner, end regions or other areas of the mask pattern designs.

Line-end distortions/deviations are generally more difficult to correct due to concerns with both line-end shortening and line-end bridging issues. These line-related issues are most difficult with line layers and structures that feature line ends that are positioned opposing and/or adjacent to each other in very close proximity. These issues pose challenges to the OPC techniques in that the OPC methods must contend with the tradeoffs of preventing line ends from being transferred as shorter or smaller than the intended designed layout pattern, and the prevention of lines from being transferred as too long or too big, causing unintended bridging or connection to either adjacent or opposite lines. Accordingly, these line end issues are also commonly known as line spacing or line extension issues, referencing respectively, to the criticality of the spacing between the line ends of the individual line structures or to the overall length of the line.

Existing OPC methods for line-ends utilize symmetric OPC structures applied to mask pattern line designs. The technique when applied correctly is an effective technique for correcting the distortions/deviations induced upon line-ends from the optical proximity effects. The added line area from the applied OPC structures will usually require photolithographic and subsequent line-forming etch processes to be more critical and precise to prevent line-to-line bridging as well as excessive line-end shortening. This degradation in the process conditions windows become worsened as the device geometries continue to shrink with newer and future device/process technology generations.

It is desired to have an OPC method that does not require small/tight process operational windows. Such an improved OPC method is also desired to be easily incorporated into existing semiconductor manufacturing operations with minimal additional requirements for the manufacturing engineers and production operators.

SUMMARY

A method is disclosed for conducting optical proximity correction (OPC) on at least two features in a circuit design. After detecting a first feature having at least one end thereof to be in the proximity of one end of a second feature, a first OPC pattern is incorporated to the end of the first feature toward a first direction; and a second OPC pattern is incorporated to the end of the second feature toward a second direction that is substantially opposite from the first direction.

Various aspects and advantages will become apparent from the following detailed description, taken in conjunction with the accompanying drawings, illustrating by way of example the principles of the disclosure.

DESCRIPTION

The present disclosure describes an improved method for applying the OPC technique of correcting the distortion/deviation of line-ends associated with optical proximity effects in semiconductor manufacturing. The disclosed method is improved over conventional methods by utilizing asymmetric structures as effective OPC serifs while providing no or minimal detrimental impact upon the optimum photolithography and subsequent line etching process conditions windows for avoiding line-end bridging and line-end shortening issues.

Figure 1A:
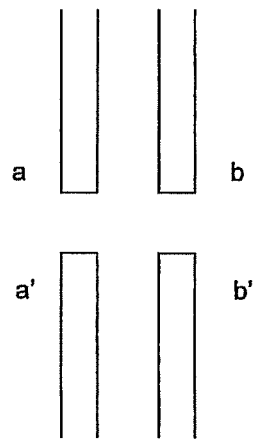
FIGS. 1A through 1C illustrate examples of mask pattern line structures of how semiconductor manufacturing operations typically approach the issues with line-end distortions/deviations.
Figure 1B:
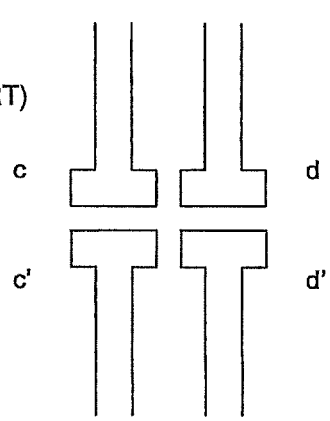
Figure 1C:
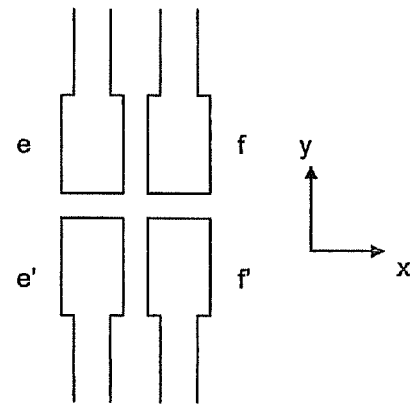

FIGS. 1A through 1C illustrate how semiconductor manufacturing operations typically approach the issues with line-end distortions/deviations. FIG. 1A shows a portion of a mask pattern comprising of 4 line-ends of which one pair of adjacent lines, a and b, are located opposing another pair of adjacent lines, a' and b' in close proximity. In this case, OPC has not been applied to these 4 line-ends. A semiconductor manufacturing operation may chose to not apply OPC to any of the 4 line-ends thus leaving the line-ends of the mask pattern as non-modified. The decision to not apply OPC is often influenced by the difficulties and concerns for operating within the reduced optimum process conditions windows caused by the added OPC structures upon the lines of close proximity.

FIG. 1B shows the same 4 line-ends as shown in FIG. 1A, with one form of OPC serifs applied to the ends of each line. In this case the applied OPC serifs transform the line-ends of the mask pattern from the straight line appearance as shown in FIG. 1A, to lines with the T-shaped line-ends as shown in FIG. 1B. The T-shaped serifs are shown as extensions of the width of the lines in the x-axis direction, occurring only at the line-ends. These T-shaped serifs are also commonly known in the industry as "hammerheads". The serifs are symmetrical in size and structure as applied to each line-end. It is also noted that the gaps and spacing between adjacent and opposite line-ends with the applied serifs are now smaller and shorter than the non-OPC lines as shown in FIG. 1A. To accommodate for the smaller gaps, shorter spaces, the photolithography and subsequent line etching process operations must perform well within their optimum process conditions windows to avoid line bridging and/or line-shortening in order for this OPC method to be effective.

FIG. 1C illustrates another form of OPC applied to the 4 line-ends of FIG. 1A. In this example, the serifs applied to the 4 line-ends manifest as expansions in both the x and y directional axis of the line-ends. It is noted again that this OPC method features line-end serifs that are symmetrical in size and structure and the gaps and spacing between adjacent and opposing line-ends are also smaller and shorter than the non-OPC lines as shown in FIG. 1A. Again, the photolithography and subsequent line etching process operations must perform well within their optimum process conditions windows to avoid line bridging and/or excessive line-shortening in order for the OPC technique to be effective.

Referring now to FIGS. 2A through 2D, there are figures illustrating examples of how asymmetric OPC structures are used in accordance with the present disclosure. It has been determined that OPC structures are not required to be symmetrical in size and shape in order to be effective for correcting line-end distortions/deviations. Asymmetric OPC structures may be effective in correcting such line-end distortions/deviations when certain preferred orientations are utilized.

Figure 2A:
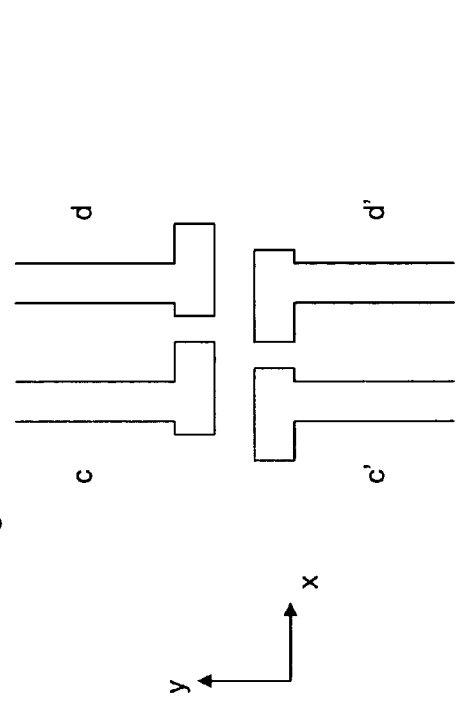
FIGS. 2A through 2D illustrate examples of asymmetric OPC structures used in accordance with the present disclosure applied to mask pattern line structures to correct line-end distortions/deviations.

FIG. 2A illustrates an example of asymmetric OPC structures used upon a portion of a mask pattern comprising of 4 line-ends of which one pair of adjacent lines, a and b, are located opposing another pair of adjacent lines, a' and b' in close proximity. OPC has been applied to the line-ends of all 4 lines so that each has a "protruding portion" extending out from the ends. The OPC structures are noted as being asymmetric as the serifs applied to the line-ends of lines a and b point towards a different direction than that applied to the line-ends of lines a' and b'. FIG. 2A specifically shows serifs applied only to the right side of the line-ends of adjacent lines a and b, along the x-axis direction. The OPC serifs applied upon the adjacent line-ends of lines a' and b' are located only onto the left side of the lines, along the x-axis. The preferred orientation of OPC serifs applied for these 4 line-ends is such that the serifs of opposing line-ends are positioned in opposing directions from the other. It can also be said that the OPC serif structures of the opposing line-ends are positioned in a substantial opposite direction from each other although it is understood that they do not have to be exactly 180 degrees apart. They only need to point to directions so different that they will not cross over each other. It is noted that the OPC structures on each line-end of the preferred example is not of the same size or shape as that of the conventional OPC method earlier illustrated in FIGS. 1B and 1C. The preferred example features an end-to-end space between the two opposing ends being less than 100 nm. The improved gap and spacing of the preferred example allows for more wider/larger process conditions windows for the photolithography and subsequent line etching processes to avoid line bridging and/or line shortening issues related to the optical proximity effects.

Figure 2B:
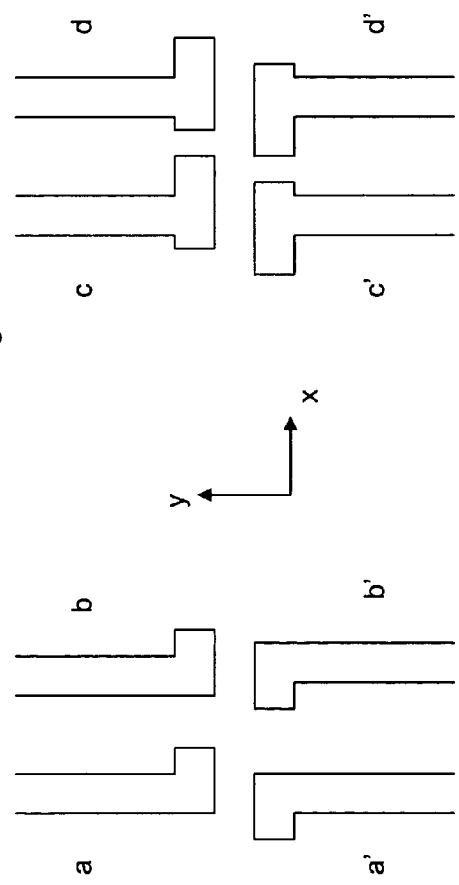

FIG. 2B illustrates another example of asymmetric OPC structures used upon a portion of a mask pattern comprising of 4 line-ends. This example is similar to the one shown as FIG. 2A. There are one pair of adjacent lines, c and d, located opposing another pair of adjacent lines, c' and d' in close proximity. OPC has been applied to the line-ends of all 4 lines. The OPC serifs applied to each line-end are aligned along the x-axis. FIG. 2B specifically shows larger serifs applied to the right side of the line-ends of adjacent lines c and d to form the protruding portions thereof, and smaller serifs applied to the left side of the same line-ends. Conversely, large OPC serifs are applied upon the left side of the opposite, adjacent line-ends of lines c' and d', while smaller serifs are located onto the right side of the line-ends. The preferred orientation of the OPC serifs are such that the larger serifs (larger OPC correction effect) of opposing line-ends are positioned in substantially opposite directions from the other. It is again noted that the OPC structures on each line-end of the this preferred example are not of the same size or shape as that of the conventional OPC method earlier illustrated in FIGS. 1B and 1C. The improved gap and spacing of this preferred example allows for more wider/larger process conditions windows for the photolithography and subsequent line etching processes to avoid line bridging and/or line shortening issues related to the optical proximity effects.

Figure 2C:
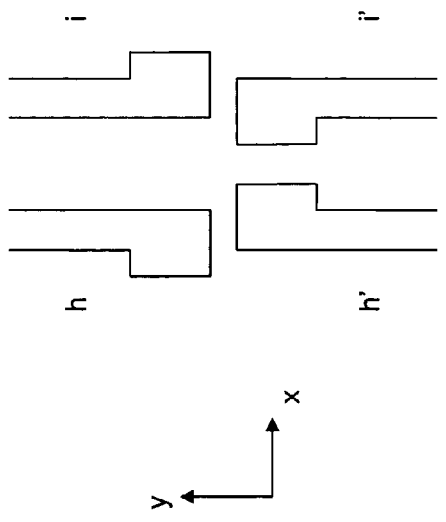

A third example of the disclosed OPC method utilizing asymmetrical OPC structures is shown in FIG. 2C. This example shows one pair of adjacent lines, e and f, located opposing another pair of adjacent lines, e' and f' in close proximity. OPC has been applied to the line-ends of all 4 lines. The OPC serifs applied to each line-end are aligned along the x-axis. FIG. 2C specifically shows serifs applied upon the line-ends of adjacent lines e and f, such that the serifs of these adjacent lines are facing towards each other. The serifs applied upon the opposing pair of adjacent line-ends e' and f', face away from each other. The OPC serif arrangement of the 4 line-ends are again such that the serifs of opposing line-ends are positioned in substantially opposite directions from the other. It is again noted that the OPC structures on each line-end of this preferred example are not of the same size or shape as that of the conventional OPC method earlier illustrated in FIGS. 1B and 1C. The improved gap and spacing of this preferred example allows for more wider/larger process conditions windows for the photolithography and subsequent line etching processes to avoid line bridging and/or line shortening issues related to the optical proximity effects. This example also illustrates the flexibility of how the improved gap and spacing provided by the use of asymmetric OPC structures may selectively target certain lines and line-end structures.

Figure 2D:
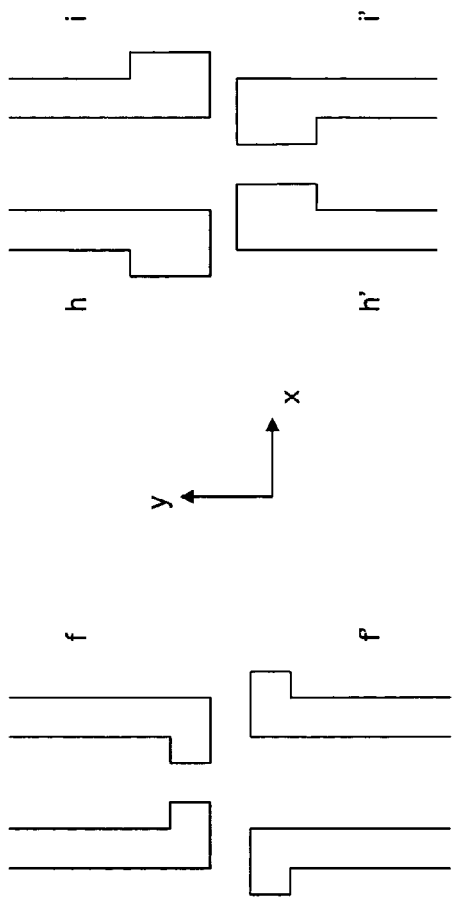

FIG. 2D illustrates an example of asymmetric OPC structures where the applied serifs enlarge the line-ends by a small amount in the x-axis and by a larger amount in the y-axis directions. The example shows a portion of a mask pattern comprising of 4 line-ends. There are one pair of adjacent lines, h and i, located opposing another pair of adjacent lines, h' and i' in close proximity. OPC has been applied to the line-ends of all 4 lines. The OPC serifs applied to each line-end are aligned along the x-axis. FIG. 2D specifically shows large serifs applied to the side of the line-ends of adjacent lines h and i, such that the serifs are facing away from each other. The serifs applied upon the opposing pair of adjacent line-ends h' and i', are facing towards each other. The OPC serif arrangement of the 4 line-ends are again such that the serifs of opposing line-ends are positioned in substantially opposite directions from the other. It is again noted that the OPC structures on each line-end of the this preferred example are not of the same size or shape as that of the conventional OPC method earlier illustrated in FIGS. 1B and 1C.

The examples also feature gaps and spacing between certain adjacent and opposing line-ends as being smaller than those of the conventional OPC method. For example, because the serifs point to opposite directions, the distance between parallel lines can be shortened as long as they are bigger than the minimum design rule. The improved OPC methods described allow for more wider/larger process conditions windows for the photolithography and subsequent line etching processes to avoid line bridging and/or line shortening issues related to the optical proximity effects.

The method of using asymmetric OPC structures offers improvement to the OPC technique for the correction of distortions and deviations of line-ends associated with optical proximity effects in semiconductor manufacturing. The disclosed method is improved over conventional methods by allowing flexibilities in using asymmetric serif structures to minimize the loss of preferred wide process operational windows for the production conditions. Such improved process operational windows will minimize the probabilities of suffering line-end shortening and line-end bridging situations.

Asymmetric OPC may also be applied to a large variety of mask pattern designs, including designs of lines and other structure layers of various alignments/orientations and material composition. The examples disclosed show the preferred embodiments of utilizing asymmetric structures that are aligned in substantially opposite directions. It is noted that other directional alignments and orientations of the asymmetric OPC serif structures may also be suffice for the correction of line-end bridging and line-end shortening issues. Distortions/deviations types that are targeted for correction by the disclosed asymmetric OPC method may also include line width variations, line corner rounding, line density and line depth of focus in addition to the described line-end shortening and line-end bridging issues.

The method disclosed is suitable and compatible for implementation within existing, conventional and future photolithography mask pattern design technologies and operations. The disclosed method may be easily integrated within conventional OPC techniques as additional OPC rules, or may be used to replace any existing OPC rules or methods. The use of asymmetric OPC serif structures can be easily incorporated into the manufacturing operations with minimal additional requirements for the manufacturing and production operators.

The above disclosure provides several examples for implementing the different features of the disclosure. Specific examples of components and processes are described to help clarify the disclosure. These are, of course, merely examples and are not intended to limit the scope of the disclosure from that described in the claims. While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for conducting optical proximity correction (OPC) on at least two features in a circuit design, comprising:
    detecting a first feature having at least one end thereof to be in the proximity of one end of a second feature;
    incorporating a first OPC pattern to the end of the first feature toward a first direction; and
    incorporating a second OPC pattern to the end of the second feature toward a second direction that is substantially opposite to the first direction.

2. The method of claim 1 wherein the first and second directions are opposite to each other.

3. The method of claim 1 wherein the first and second OPC patterns are the same.

4. The method of claim 1 wherein the first and second features are substantially linearly aligned.

5. The method of claim 1 wherein the first and second features are substantially parallel to each other.

6. The method of claim 5 wherein an end-to-end space between the first and second features is smaller than 100 nm.

7. The method of claim 1 wherein a line-to-line space between the first and second features is larger than a predetermined design rule.

8. A method for conducting optical proximity correction (OPC) on at least two groups of features in a circuit design, comprising:
   detecting a first group of features having their first ends in the proximity of first ends of a second group of features while maintaining a predetermined end-to-end space therebetween;
   incorporating a first OPC pattern into the first ends of the features of the first group toward a first direction; and
   incorporating a second OPC pattern to the first ends of the features of the second group toward a second direction that is substantially opposite to the first direction.

9. The method of claim 8 wherein the first and second directions are opposite to each other.

10. The method of claim 8 wherein the first and second OPC patterns are the same.

11. The method of claim 8 wherein the first and second group of features are substantially linearly aligned.

12. The method of claim 8 wherein the features of the first group are substantially parallel to each other, and the features of the second group are substantially parallel to each other.

13. The method of claim 8 wherein an end-to-end space between the first and second groups of features is smaller than 100 nm.

14. The method of claim 8 wherein a line-to-line space between the features within one of the first and second groups is larger than a predetermined design rule.

15. A method for conducting optical proximity correction (OPC) on at least three features in a circuit design, comprising:
   detecting a first feature having at least one end thereof to be in the proximity of ends of a second and third features;
   incorporating a first OPC pattern to the end of the first feature;
   incorporating a second OPC pattern to the end of the second feature;
   incorporating a third OPC pattern to the end of the third feature,
   wherein a protruding portion of the first OPC pattern points to a direction that is substantially opposite to directions pointed to by protruding portions of the second and third OPC patterns so that an end-to-end space between any two features can be minimized.

16. The method of claim 15 wherein the protruding portion of the first feature points to a direction opposite to that pointed to by either the protruding portion of the second or third features.

17. The method of claim 15 wherein the first, second, and third OPC patterns are the same.

18. The method of claim 15 wherein the first and second features are substantially linearly aligned and the third feature is parallel to the first and second features.

19. The method of claim 18 wherein the protruding portion of the first feature points to a direction opposite to that pointed to by both the second and third features.

20. The method of claim 18 wherein the protruding portion of the first feature points to a direction opposite to that pointed to by the protruding portion of the second feature and in the same direction as the protruding portion of the third feature.

21. The method of claim 18 wherein an end-to-end space between the first and second features is smaller than 100 nm.

* * * * *